(12) United States Patent
Youn et al.

(10) Patent No.: US 7,704,788 B2
(45) Date of Patent: Apr. 27, 2010

(54) METHODS OF FABRICATING MULTI-BIT PHASE-CHANGE MEMORY DEVICES AND DEVICES FORMED THEREBY

(75) Inventors: Sun-Pil Youn, Incheon (KR); Jin-Tae Kang, Gyeonggi-do (KR); Young-Jae Joo, Gyeonggi-do (KR); Hyeong-Jun Kim, Seoul (KR); Jae-Min Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 12/062,905

(22) Filed: Apr. 4, 2008

(65) Prior Publication Data
US 2008/0248632 A1 Oct. 9, 2008

(30) Foreign Application Priority Data
Apr. 6, 2007 (KR) .................. 10-2007-0034246
Jul. 5, 2007 (KR) .................. 10-2007-0067620

(51) Int. Cl.
*H01L 21/06* (2006.01)
*H01L 21/00* (2006.01)

(52) U.S. Cl. ...................... 438/102; 438/95; 257/2; 257/3

(58) Field of Classification Search .............. 438/3, 438/95, 102; 257/2, 3, 246
See application file for complete search history.

(56) References Cited

U.S. PATENT DOCUMENTS

| | | | |
|---|---|---|---|
| 6,625,054 B2 | 9/2003 | Lowrey et al. | |
| 6,687,153 B2 | 2/2004 | Lowrey | |
| 6,927,410 B2 | 8/2005 | Chen | |
| 7,012,273 B2 | 3/2006 | Chen | |
| 7,052,941 B2 | 5/2006 | Lee | |
| 7,335,906 B2 | 2/2008 | Toda | |
| 7,488,968 B2 * | 2/2009 | Lee ............................. 257/4 |
| 2004/0178404 A1 | 9/2004 | Ovshinsky | |
| 2005/0003602 A1 | 1/2005 | Lowrey et al. | |
| 2005/0009286 A1 | 1/2005 | Hsu et al. | |
| 2005/0015354 A1 | 1/2005 | Grubbs et al. | |
| 2005/0051901 A1 | 3/2005 | Chen | |

(Continued)

FOREIGN PATENT DOCUMENTS

JP 2006-179778 6/2006

(Continued)

OTHER PUBLICATIONS

Korean Office Action, Korean Application No. 10-2007-0034246, Mar. 13, 2006.

*Primary Examiner*—Ha Tran T Nguyen
*Assistant Examiner*—Aaron A Dehne
(74) *Attorney, Agent, or Firm*—Myers Bigel Sibley & Sajovec

(57) ABSTRACT

Methods of forming integrated circuit devices include forming at least one non-volatile memory cell on a substrate. The memory cell includes a plurality of phase-changeable material regions therein that are electrically coupled in series. This plurality of phase-changeable material regions are collectively configured to support at least 2-bits of data when serially programmed using at least four serial program currents. Each of the plurality of phase-changeable material regions has different electrical resistance characteristics when programmed.

21 Claims, 14 Drawing Sheets

U.S. PATENT DOCUMENTS

| | | |
|---|---|---|
| 2005/0112896 A1* | 5/2005 | Hamann et al. ............. 438/694 |
| 2005/0247922 A1 | 11/2005 | Oh et al. |
| 2006/0077741 A1 | 4/2006 | Wang et al. |
| 2006/0226411 A1 | 10/2006 | Lee |
| 2007/0047296 A1 | 3/2007 | Philipp et al. |
| 2007/0097739 A1 | 5/2007 | Happ et al. |
| 2007/0153570 A1 | 7/2007 | Suh |
| 2007/0249083 A1 | 10/2007 | Li et al. |
| 2008/0017894 A1* | 1/2008 | Happ et al. ................. 257/246 |
| 2008/0019257 A1 | 1/2008 | Philipp et al. |
| 2008/0025081 A1 | 1/2008 | Cho et al. |
| 2008/0237566 A1 | 10/2008 | An et al. |
| 2009/0026439 A1 | 1/2009 | Park et al. |

FOREIGN PATENT DOCUMENTS

| | | |
|---|---|---|
| JP | 2006-222215 | 8/2006 |
| KR | 1020030087426 A | 11/2003 |
| KR | 10-2005-0087154 | 8/2005 |
| KR | 1020060001054 A | 1/2006 |

* cited by examiner

METHODS OF FABRICATING MULTI-BIT PHASE-CHANGE MEMORY DEVICES AND DEVICES FORMED THEREBY

REFERENCE TO PRIORITY APPLICATIONS

This application claims the benefit of Korean Patent Application Nos. 10-2007-0034246 and 10-2007-0067620, filed Apr. 6, 2007, and Jul. 5, 2007, respectively, the contents of which are hereby incorporated herein by reference in their entirety.

FIELD OF THE INVENTION

The present invention relates to semiconductor memory devices, and more particularly, to methods of fabricating phase-change memory devices and devices formed thereby.

BACKGROUND OF THE INVENTION

Semiconductor memory devices may be classified into volatile memory devices and nonvolatile memory devices. The nonvolatile memory devices do not lose data stored therein even if power is cut off. Thus, nonvolatile memory devices have been widely applied to mobile communication systems, portable memory devices, and auxiliary memory devices of digital apparatus.

A great deal of research has been conducted to develop new nonvolatile memory devices that are efficiently structured to improve integration density. As a result, phase-change memory devices have been proposed. A unit cell of the phase-change memory device includes a switching device and a data storage element that is serially connected to the switching device. The data storage element includes a lower electrode, which is electrically connected to the switching device, and a phase-change material layer, which is in contact with the lower electrode. The phase-change material layer is formed of a material that can be electrically switched between amorphous and crystalline states or between various resistive states within the crystalline state, depending on the magnitude of supplied current.

FIG. 1 is a partial cross-sectional view of a conventional phase-change memory device. Referring to FIG. 1, the phase-change memory device includes a lower insulating layer 12 disposed on a predetermined region of a semiconductor substrate 11, a lower electrode 14 disposed in the lower insulating layer 12, an upper insulating layer 13 disposed on the lower insulating layer 12, a bit line 18 disposed on the upper insulating layer 13, a phase-change pattern 16 disposed in the upper insulating layer 13 (and in contact with the lower electrode 14), and an upper electrode 17 electrically connecting the phase-change pattern 16 to the bit line 18. Also, the lower electrode 14 is electrically connected to a switching device such as a diode or a transistor.

When a program current is supplied through the lower electrode 14, Joule heat is generated at an interface between the phase-change pattern 16 and the lower electrode 14. Due to the Joule heat, a portion (hereinafter, a "transition region 20") of the phase-change pattern 16 is changed into an amorphous state or a crystalline state. The transition region 20 has a higher resistivity when it is in the amorphous state than when it is in the crystalline state. Thus, by detecting the current flowing through the transition region 20 in a read mode, it can be determined whether data stored in the phase-change pattern 16 of the phase-change memory device is a logic '1' or a logic '0.'

Here, the program current should increase in proportion to the area of the transition region 20. In this case, the switching device should be designed to have sufficient current drivability to supply the program current. However, the area occupied by the switching device is increased to improve the current drivability of the switching device. In other words, the transition region 20 with a smaller area is more advantageous to improving the integration density of the phase-change memory device.

Meanwhile, there have been extensive studies on techniques of storing multi-bit data in a single cell to increase the integration density of phase-change memory devices. Since the resistivity of the aforementioned phase-change material layer can vary within a wide range with a ratio of an amorphous structure to a crystalline structure, the phase-change material layer can theoretically store multi-bit data in a unit cell.

A multi-bit phase-change memory device is disclosed in U.S. Patent Publication No. 2004-0178404 entitled "Multiple Bit Chalcogenide Storage Device" by Ovshinsky. According to Ovshinsky, a phase-change memory cell includes three electrodes, which are respectively in contact with an upper surface, a bottom surface, and a lateral surface of a phase-change material layer. The phase of an upper region of the phase-change material layer is changed using the electrodes in contact with the upper and lateral surfaces of the phase-change material layer, and the phase of a lower region of the phase-change material layer is changed using the electrodes in contact with the bottom and lateral surfaces of the phase-change material layer, so that 2-bit data can be stored in a unit cell. However, the structure and fabrication process of the phase-change memory cell may become complicated, as may the configuration of a peripheral circuit for supplying a program current.

SUMMARY OF THE INVENTION

A method of fabricating a phase-change memory device includes forming an interlayer insulating layer having a contact hole on a substrate. A first electrode is formed to partially fill the contact hole. A first phase-change pattern is formed on the first electrode in the contact hole. An intermediate electrode is formed on the first phase-change pattern. A second phase-change pattern is formed on the intermediate electrode. A second electrode is formed on the interlayer insulating layer and is electrically connected to the second phase-change pattern.

A glue layer having a heterogeneity element may be formed on the second phase-change pattern. The heterogeneity element may be at least one selected from the group consisting of Ti, B, In, and Sn. The heterogeneity element may be diffused into the second phase-change pattern to form a heterogeneity phase-change pattern. Diffusing the heterogeneity element into the second phase-change pattern may be performed using a thermal treatment process.

The intermediate electrode may be formed of one selected from the group consisting of TiN layer, TiAlN layer, and MoTiN layer. The contact hole formed on the first phase-change pattern may be extended after forming the first phase-change pattern. A spacer may be formed on a sidewall of the contact hole before forming the first electrode. In this case, the spacer formed on the first phase-change pattern may be exposed and the exposed spacer may be isotropically etched to extend the contact hole.

A contact surface of the intermediate electrode and the second phase-change pattern may be formed wider than that of the intermediate electrode and the first phase-change pattern. The first phase-change pattern may be formed of a compound of at least two selected from the group consisting of Ge, Sb, Te, Se, Bi, Pb, Sn, Ag, Au, As, Pd, In, Ti, S, Si, P, O, and C. The second phase-change pattern may be formed of a compound of at least two selected from the group consisting of Ge, Sb, Te, Se, Bi, Pb, Sn, Ag, Au, As, Pd, In, Ti, S, Si, P, O, and C. The second phase-change pattern may be formed to have a different electrical resistance from the first phase-change pattern. The second phase-change pattern may be formed of a different material from the first phase-change pattern.

A phase-change memory device according to additional embodiments of the invention includes a first electrode disposed on a substrate. A second electrode is disposed apart from the first electrode. A data storage element is interposed between the first and second electrodes. The data storage element includes at least one intermediate electrode and a plurality of phase-change patterns.

The data storage element may include a first phase-change pattern, which is in contact with the first electrode. A second phase-change pattern may be in contact with the second electrode. A first intermediate electrode may be interposed between the first and second phase-change patterns. The second phase-change pattern may have a larger width than the first phase-change pattern. A contact surface of the first intermediate electrode and the second phase-change pattern may be wider than that of the first intermediate electrode and the first phase-change pattern.

A glue layer may be interposed between the second phase-change pattern and the second electrode. The glue layer may include a heterogeneity element. The heterogeneity element may be at least one selected from the group consisting of Ti, B, In, and Sn. The second phase-change pattern may include the diffused heterogeneity element. The second phase-change pattern may have a different electrical resistance from the first phase-change pattern. A third phase-change pattern may be interposed between the first phase-change pattern and the first intermediate electrode. A second intermediate electrode may be interposed between the first phase-change pattern and the third phase-change pattern.

An interlayer insulating layer may be disposed on the substrate. The data storage element may be disposed in a contact hole penetrating the interlayer insulating layer. The first electrode may be disposed in the contact hole. Further, a spacer may be disposed between the interlayer insulating layer and the data storage element. The first intermediate electrode may be one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a MoTiN layer, a NbN layer, a ZrSiN layer, a ZrAlN layer, a conductive carbon group layer, and a Cu layer. A word line may be electrically connected to the first electrode. A bit line may be electrically connected to the second electrode. A switching device (e.g., diode, transistor) may be electrically connected to the first electrode.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF THE INVENTION

Figure 1:
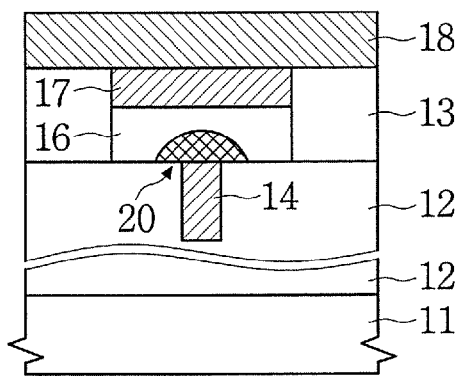
FIG. 1 is a partial cross-sectional view of a conventional phase-change memory device.

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure is thorough and complete and fully conveys the scope of the invention to one skilled in the art. In the drawings, the thicknesses of layers and regions are exaggerated for clarity. It will also be understood that when a layer is referred to as being "on" another layer or substrate, it can be directly on the other layer or substrate or intervening layers may also be present. The same reference numerals are used to denote the same elements throughout the specification.

Figure 2:
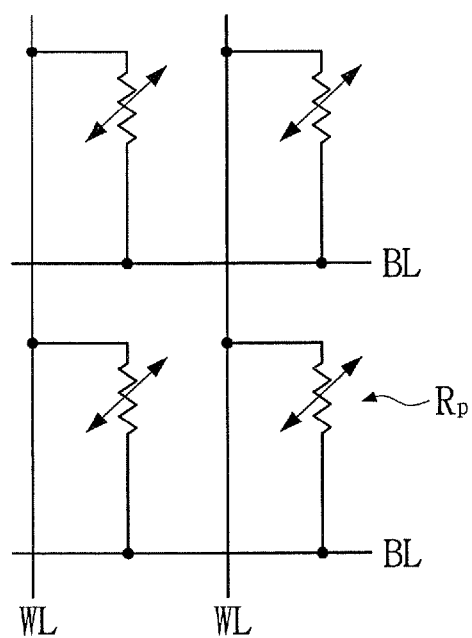
FIG. 2 is an equivalent circuit diagram of a portion of a cell array region of a phase-change memory device according to first and second exemplary embodiments of the present invention.
Figure 3:
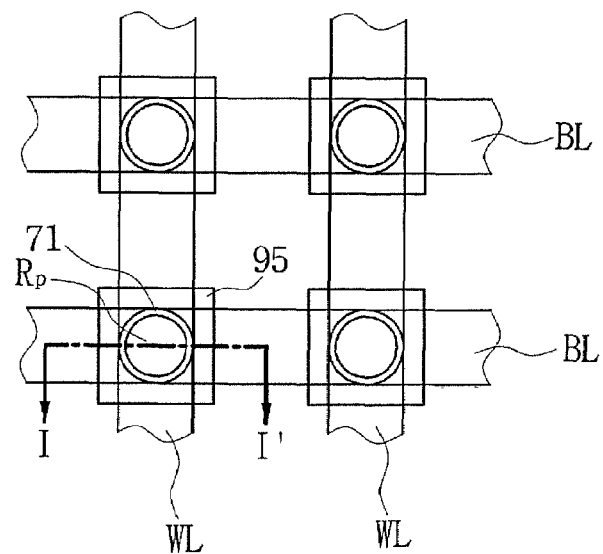
FIG. 3 is a plan view of the portion of the cell array region of the phase-change memory device shown in FIG. 2.

FIG. 2 is an equivalent circuit diagram of a portion of a cell array region of a phase-change memory device according to first and second exemplary embodiments of the present invention, and FIG. 3 is a plan view of the portion of the cell array region of the phase-change memory device shown in FIG. 2. FIGS. 4 through 8 are cross-sectional views taken along line I-I' of FIG. 3, which illustrate a phase-change memory device according to a first exemplary embodiment of the present invention and a fabrication method thereof. FIG. 9 is a cross-sectional view taken along line I-I' of FIG. 3, which illustrates a phase-change memory device according to a second exemplary embodiment of the present invention and a fabrication method thereof.

Referring to FIGS. 2 and 3, a phase-change memory device according to first and second exemplary embodiments of the present invention may include word lines WL, which are disposed parallel to one another in a column direction, bit lines BL, which are disposed parallel to one another in a row direction, and a plurality of data storage elements $R_P$.

The bit lines BL may cross-over the word lines WL. The data storage elements $R_P$ may be disposed at intersections of the bit lines BL and the word lines WL, respectively. First electrodes 71 may be interposed between the data storage elements $R_P$ and the word lines WL. Second electrodes 95 may be interposed between the data storage element $R_P$ and the bit lines BL.

Figure 4:
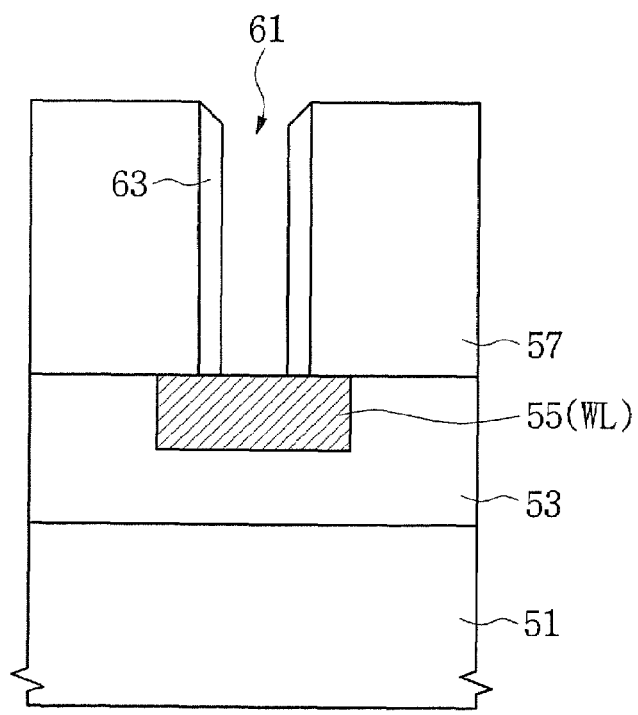
FIGS. 4 through 8 are cross-sectional views taken along line I-I' of FIG. 3, which illustrate a phase-change memory device according to a first exemplary embodiment of the present invention and a fabrication method thereof.

A method of fabricating the phase-change memory device according to a first exemplary embodiment of the present invention will now be described with reference to FIGS. 3 through 8. Referring to FIGS. 3 and 4, a lower insulating layer 53 may be formed on a substrate 51. The substrate 51 may be a semiconductor substrate such as a silicon wafer. The lower insulating layer 53 may be formed of a silicon oxide layer, a silicon nitride layer, a silicon oxynitride layer, or combinations thereof. A word line WL 55 may be formed in the lower insulating layer 53. An upper surface of the lower insulating layer 53 and an upper surface of the word line WL 55 may be exposed at the same level. The word line WL 55 may be formed of a conductive pattern such as a polysilicon (poly-Si) pattern, a metal interconnection, or an epitaxial semiconductor pattern.

An interlayer insulating layer 57 may be formed on the word line WL 55 and the lower insulating layer 53. The interlayer insulating layer 57 may be formed of a silicon oxide layer, a silicon nitride layer, a silicon oxynitride layer, or combinations thereof. The interlayer insulating layer 57 may be formed to have a planarized upper surface.

A contact hole 61 may be formed through the interlayer insulating layer 57 on the word line WL 55. The word line WL 55 may be exposed through a bottom of the contact hole 61. Also, the interlayer insulating layer 57 may be exposed on a sidewall of the contact hole 61. A spacer 63 may be formed on a sidewall of the contact hole 61. The spacer 63 may be formed of an insulating layer such as a silicon oxide layer, a silicon nitride layer, a silicon oxynitride layer, or combinations thereof. As a result, the inside diameter of the contact hole 61 may become small. Alternatively, the spacer 63 may be formed to partially cover the sidewall of the contact hole 61 or may even be omitted in alternative embodiments.

Figure 5:
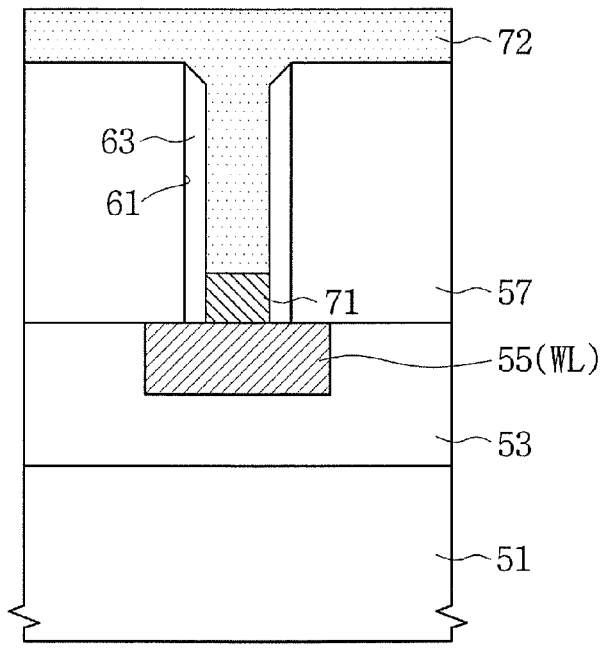

Referring to FIGS. 3 and 5, a first electrode 71 may be formed in the contact hole 61. After the contact hole 61 is filled with a first conductive layer (not shown), the first conductive layer may be etched back to form the first electrode 71. The first electrode 71 may be in direct contact with the word line WL 55. Thus, the first electrode 71 may be formed at a lower level than the upper surface of the interlayer insulating layer 57. The spacer 63 may also be formed after forming the first electrode 71. In this case, the spacer 63 may be formed at a higher level than the first electrode 71.

The first electrode 71 may be formed of an electrically conductive material selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a MoTiN layer, a NbN layer, a ZrSiN layer, a ZrAlN layer, a conductive carbon group layer, a Cu layer, and combinations thereof.

A first phase-change material layer 72 may be formed on the first electrode 71 to fill the contact hole 61. The first phase-change material layer 72 may be formed as a compound of at least two materials selected from the group consisting of Ge, Sb, Te, Se, Bi, Pb, Sn, Ag, Au, As, Pd, In, Ti, S, Si, P, O, and C. For example, the first phase-change material layer 72 may be formed as a Ge—Sb—Te (GST) layer.

Figure 6:
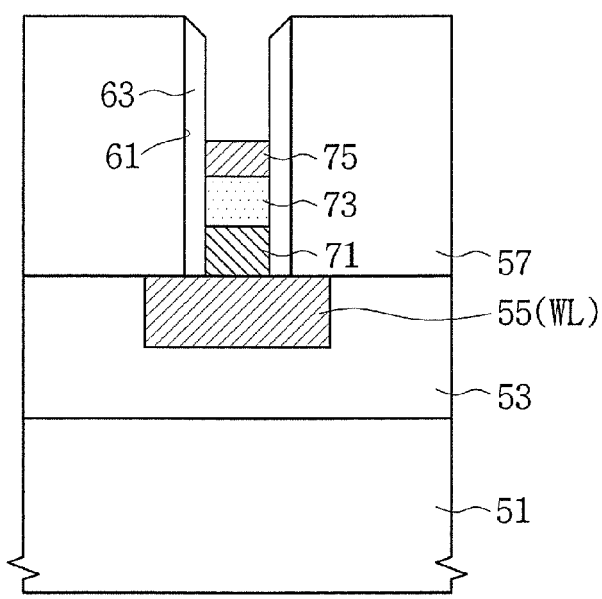

Referring to FIGS. 3 and 6, the first phase-change material layer 72 may be etched back to form a first phase-change pattern 73 on the first electrode 71. The first phase-change pattern 73 may be formed in an intermediate region of the contact hole 61. Thus, the first phase-change pattern 73 may be formed at a lower level than the upper surface of the interlayer insulating layer 57. The first phase-change pattern 73 may be in direct contact with the first electrode 71.

An intermediate electrode 75 may be formed on the first phase-change pattern 73. The intermediate electrode 75 may be formed by filling the contact hole 61 on the first phase-change pattern 73 with an intermediate conductive layer and etching-back the intermediate conductive layer. The intermediate electrode 75 may be in direct contact with the first phase-change pattern 73. The intermediate electrode 75 may be formed in the intermediate region of the contact hole 61. Thus, the intermediate electrode 75 may be formed at a lower level than the upper surface of the interlayer insulating layer 57.

The intermediate electrode 75 may be formed of an electrically conductive material selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a MoTiN layer, a NbN layer, a ZrSiN layer, a ZrAlN layer, a conductive carbon group layer, a Cu layer, and combinations thereof. The intermediate electrode 75 may be formed of the same material as the first electrode 71 or a different material from the first electrode 71.

Figure 7:
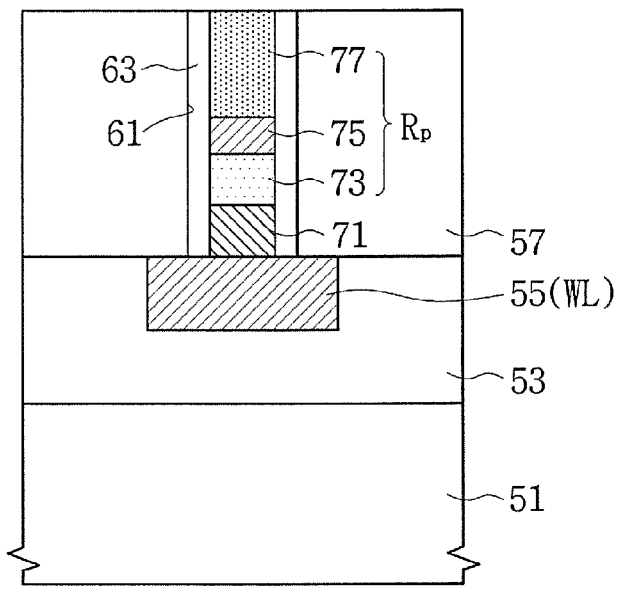

Referring to FIGS. 3 and 7, a second phase-change pattern 77 may be formed on the intermediate electrode 75. Specifically, a second phase-change material layer (not shown) may be formed on the intermediate electrode 75 to fill the contact hole 61. The second phase-change material layer may be planarized to form the second phase-change pattern 77. The planarization of the second phase-change material layer may be performed using a chemical mechanical polishing (CMP) process employing the interlayer insulating layer 57 as an etch-stop layer. In this case, the upper surfaces of the interlayer insulating layer 57 and the second phase-change pattern 77 may be exposed at the same level. Alternatively, the planarization of the second phase-change material layer may be performed using another etch-back process alone or in combination with CMP.

The second phase-change pattern 77 may be formed as a compound of at least two materials selected from the group consisting of Ge, Sb, Te, Se, Bi, Pb, Sn, Ag, Au, As, Pd, In, Ti, S, Si, P, I, and C. The second phase-change pattern 77 may be formed of the same material as the first phase-change pattern 73 or a different material from the first phase-change pattern 73.

The first phase-change pattern 73, the intermediate electrode 75, and the second phase-change pattern 77 may constitute a data storage element $R_P$. The first phase-change pattern 73 may have different electrical resistance characteristics from the second phase-change pattern 77.

Figure 8:
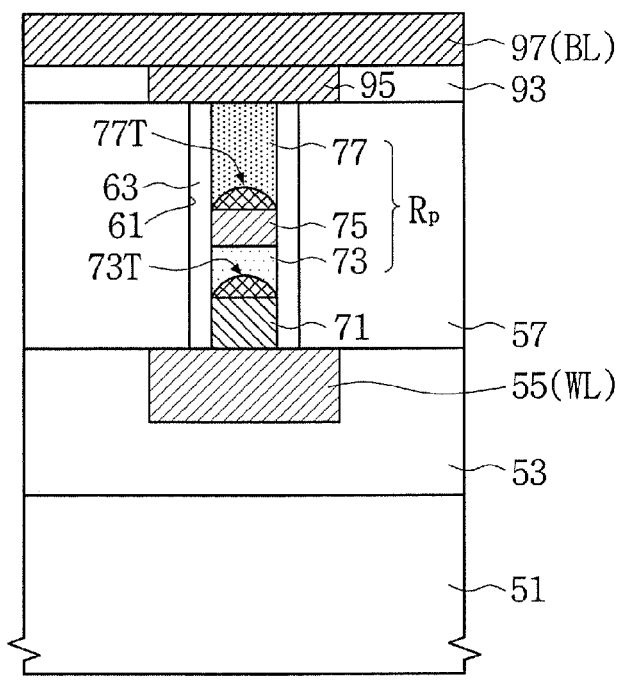
Figure 9:
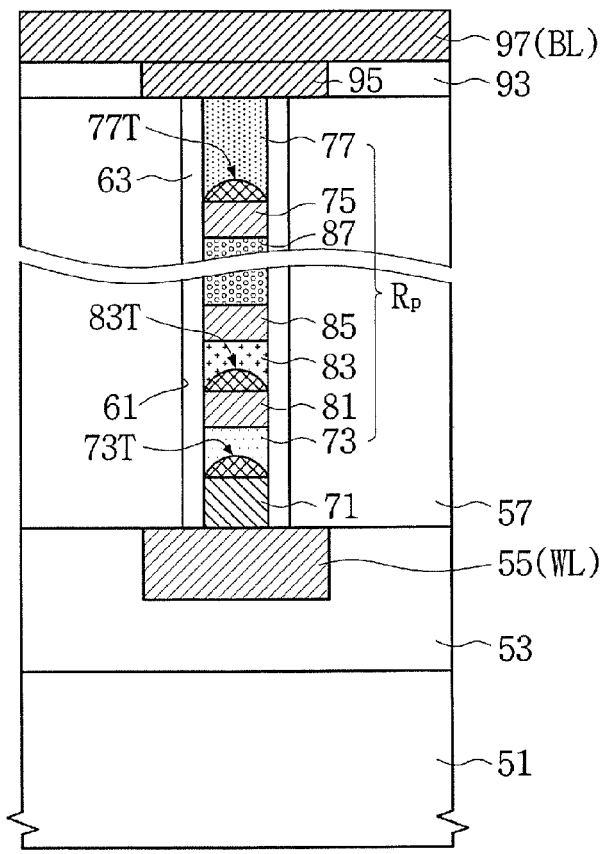
FIG. 9 is a cross-sectional view taken along line I-I' of FIG. 3, which illustrates a phase-change memory device according to a second exemplary embodiment of the present invention and a fabrication method thereof.

Referring to FIGS. 3 and 8, a second electrode 95 and an upper insulating layer 93 may be formed on the interlayer insulating layer 57. The second electrode 95 may be formed in direct contact with the second phase-change pattern 77 on the interlayer insulating layer 57. The upper insulating layer 93 may be formed to cover the interlayer insulating layer 57.

The second electrode 95 may be formed of an electrically conductive material selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a MoTiN layer, a NbN layer, a ZrSiN layer, a ZrAlN layer, a conductive carbon group layer, a Cu layer, and combinations thereof. The second electrode 95 may be formed of the same material as the first electrode 71 or a different material from the first electrode 71. The upper insulating layer 93 may be a silicon oxide layer, a silicon nitride layer, a silicon oxynitride layer, or combinations thereof.

A bit line BL 97 may be formed on the upper insulating layer 93. The bit line BL 97 may be formed in direct contact with the second electrode 95. The bit line BL 97 may be formed of an electrically conductive material. Alternatively, the second electrode 95 may be omitted. In this case, the bit line BL 97 may be in direct contact with the second phase-change pattern 77.

Hereinafter, an operation of the phase-change memory device according to the first exemplary embodiment of the present invention will be described with reference to FIGS. 2, 3, and 8. Referring to FIGS. 2, 3, and 8, the phase-change memory device according to the first exemplary embodiment of the present invention may perform a program operation by supplying a program current through the first and second electrodes 71 and 95 to the data storage element $R_P$.

Specifically, when both the first and second phase-change patterns 73 and 77 are in an amorphous state, the data storage element $R_P$ may exhibit a first composite resistance. The first composite resistance may be understood as a value corresponding to the sum of a reset resistance of the first phase-change pattern 73 and a reset resistance of the second phase-change pattern 77 when the first and second phase-change patterns 73 and 77 are connected in series.

When a first program current is supplied to the data storage element $R_P$, a first transition region 73T may be generated in the first phase-change pattern 73. The first transition region 73T may be formed adjacent to the first electrode 71. The first transition region 73T may be in a crystalline state. In this case, the data storage element $R_P$ exhibits a lower second composite resistance than the first composite resistance. The second composite resistance may be understood as a value corresponding to the sum of a program resistance of the first phase-change pattern 73 and a reset resistance of the second phase-change pattern 77 when the first and second phase-change patterns 73 and 77 are connected in series.

Thereafter, when a second program current larger than the first program current is supplied to the data storage element $R_P$, a second transition region 77T may be generated in the second phase-change pattern 77. The second transition region 77T may be formed adjacent to the intermediate electrode 75. The second transition region 77T may be in a crystalline state. In this case, the data storage element $R_P$ exhibits a lower third composite resistance than the second composite resistance. The third composite resistance may be understood as a value corresponding to the sum of a program resistance of the first phase-change pattern 73 and a program resistance of the second phase-change pattern 77 when the first and second phase-change patterns 73 and 77 are connected in series.

Thereafter, when a third program current larger than the second program current is supplied to the data storage element $R_P$, the first phase-change pattern 73 may return to the amorphous state. In this case, the data storage element $R_P$ may exhibit a fourth composite resistance. The fourth composite resistance may be lower than the first composite resistance and higher than the second composite resistance. The fourth composite resistance may be understood as a value corresponding to the sum of the reset resistance of the first phase-change pattern 73 and the program resistance of the second phase-change pattern 77 when the first and second phase-change patterns 73 and 77 are connected in series.

Furthermore, when a fourth program current larger than the third program current is supplied to the data storage element $R_P$, the second phase-change pattern 77 may return to the amorphous state. In this case, the data storage element $R_P$ may have the first composite resistance again.

As described above, the data storage element $R_P$ may have the first through fourth composite resistances in response to the first through fourth program currents. Thus, the data storage element $R_P$ can be programmed in four states. In this case, the data storage element $R_P$ can store 2-bit data.

Hereinafter, a method of fabricating a phase-change memory device according to a second exemplary embodiment of the present invention and an operation thereof will be described with reference to FIGS. 3 and 9. Referring to FIGS. 3 and 9, a lower insulating layer 53, a word line WL 55, an interlayer insulating layer 57, a contact hole 61, a spacer 63, a first electrode 71, and a first phase-change pattern 73 may be formed on a substrate 51, as described above with reference to FIG. 4.

A plurality of intermediate electrodes 75, 81, and 85 spaced apart from each other and a plurality of intermediate phase-change patterns 83 and 87 spaced apart from each other may be alternately and sequentially stacked on the first phase-change pattern 73. For example, the intermediate electrodes 75, 81, and 85 may include a first intermediate electrode 75, a second intermediate electrode 81, and a third intermediate electrode 85. The second intermediate electrode 81 may be in contact with the first phase-change pattern 73. The intermediate phase-change patterns 83 and 87 may include a first intermediate phase-change pattern 83 and a second intermediate phase-change pattern 87. The first intermediate electrode 75 may be formed on the second intermediate phase-change pattern 87.

A second phase-change pattern 77 may be formed on the first intermediate electrode 75. The first electrode 71, the first phase-change pattern 73, the second intermediate electrode 81, the first intermediate phase-change pattern 83, the third intermediate electrode 85, the second intermediate phase-change pattern 87, the first intermediate electrode 75, and the second phase-change pattern 77 may be sequentially stacked in the contact hole 61, as illustrated.

As described above with reference to FIG. 8, a second electrode 95, an upper insulating layer 93, and a bit line 97 may be formed on the second phase-change pattern 77. The phase-change patterns 73, 77, 83, and 87 may be formed of the same material or different materials. Each of the phase-change patterns 73, 77, 83, and 87 may be formed as a compound of at least two materials selected from the group consisting of Ge, Sb, Te, Se, Bi, Pb, Sn, Ag, Au, As, Pd, In, Ti, S, Si, P, O, and C. The phase-change patterns 73, 77, 83, and 87 may have different electrical resistance characteristics from each other.

The electrodes 71, 75, 81, 85, and 95 may be formed of the same material or different materials. Each of the electrodes 71, 75, 81, 85, and 95 may be formed of a material selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a MoTiN layer, a NbN layer, a ZrSiN layer, a ZrAlN layer, a conductive carbon group layer, a Cu layer, and combinations thereof.

The first phase-change pattern 73, the second intermediate electrode 81, the first intermediate phase-change pattern 83, the third intermediate electrode 85, the second intermediate phase-change pattern 87, the first intermediate electrode 75, and the second phase-change pattern 77 may constitute a data storage element $R_P$. Also, the first electrode 71, the first phase-change pattern 73, the second intermediate electrode 81, the first intermediate phase-change pattern 83, the third intermediate electrode 85, the second intermediate phase-change pattern 87, the first intermediate electrode 75, the second phase-change pattern 77, and the second electrode 95 may be electrically connected in series, as illustrated.

The phase-change memory device according to the second exemplary embodiment of the present invention may perform a program operation by supplying a program current through the first and second electrodes 71 and 95 to the data storage element $R_P$. In response to the program current, a first transition region 73T may be generated in the first phase-change pattern 73, a second transition region 77T may be generated in the second phase-change pattern 77, a third transition region 83T may be generated in the first intermediate phase-change pattern 83, and a fourth transition region (not shown) may be generated in the second intermediate phase-change pattern 87. In this case, the data storage element $R_P$ can store 4-bit data. As described above, the data storage element $R_P$ may include other intermediate electrodes (not shown) and other phase-change patterns (not shown). In this case, the data storage element $R_P$ can store multi-bit data.

Figure 10:
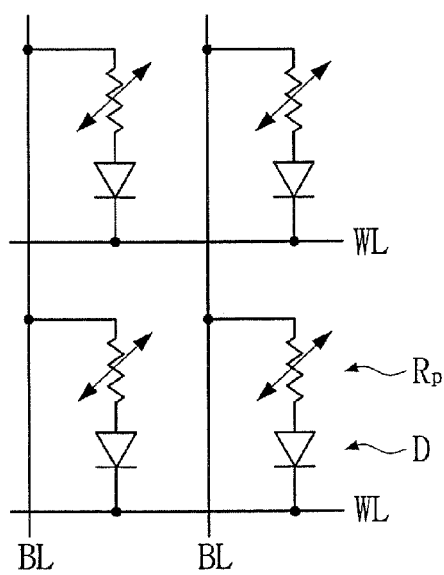
FIG. 10 is an equivalent circuit diagram of a portion of a cell array region of a phase-change memory device according to third to fifth exemplary embodiments of the present invention.
Figure 11:
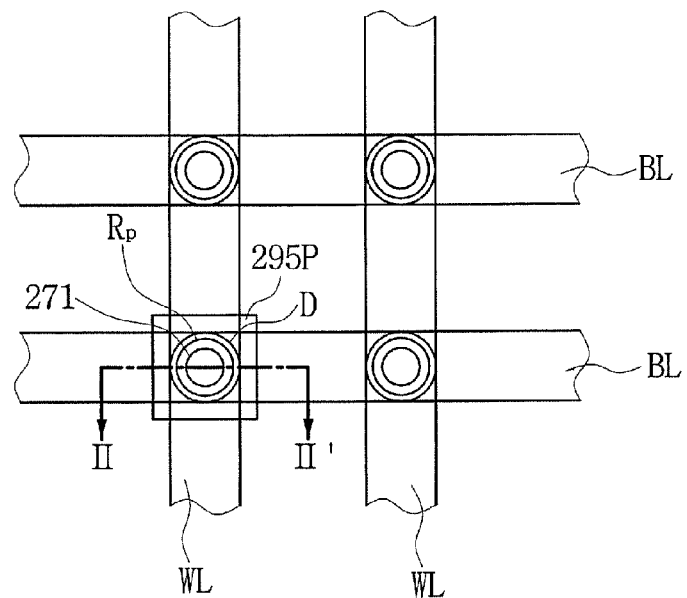
FIG. 11 is a plan view of the portion of the cell array region of the phase-change memory device shown in FIG. 10.

FIG. 10 is an equivalent circuit diagram of a portion of a cell array region of a phase-change memory device according to third to fifth exemplary embodiments of the present invention, and FIG. 11 is a plan view of the portion of the cell array region of the phase-change memory device shown in FIG. 10. FIGS. 12 through 18 are cross-sectional views taken along line II-II' of FIG. 11, which illustrate a phase-change memory device according to a third exemplary embodiment of the present invention and a fabrication method thereof, and FIGS. 19 through 23 are cross-sectional views taken along line II-II' of FIG. 11, which illustrate a phase-change memory device according to a fourth exemplary embodiment of the present invention and a fabrication method thereof. FIG. 24 is a cross-sectional view taken along line II-II' of FIG. 11, which illustrates a phase-change memory device according to a fifth exemplary embodiment of the present invention and a fabrication method thereof.

Referring to FIGS. 10 and 11, a phase-change memory device according to the third to fifth exemplary embodiments of the present invention includes word lines WL, which are disposed parallel to one another in a column direction, bit lines BL, which are disposed parallel to one another in a row direction, a plurality of data storage elements $R_P$, and a plurality of diodes D.

The bit lines BL may cross-over the word lines WL. The data storage elements $R_P$ may be disposed at intersections of the bit lines BL and the word lines WL, respectively. Each of the diodes D may be serially connected to the corresponding one of the data storage elements $R_P$. Lower electrodes 271 may be disposed between the diodes D and the data storage elements $R_P$. One end of each of the data storage elements $R_P$ may be connected to the corresponding one of the bit lines BL. Upper electrodes 295P may be disposed between the data storage elements $R_P$ and the bit lines BL. Each of the diodes D may be connected to the corresponding one of the word lines WL. The diodes D may function as switching devices. However, the diodes D may be omitted. Alternatively, MOS transistors may be used as the switching devices instead of the diodes D.

Figure 12:
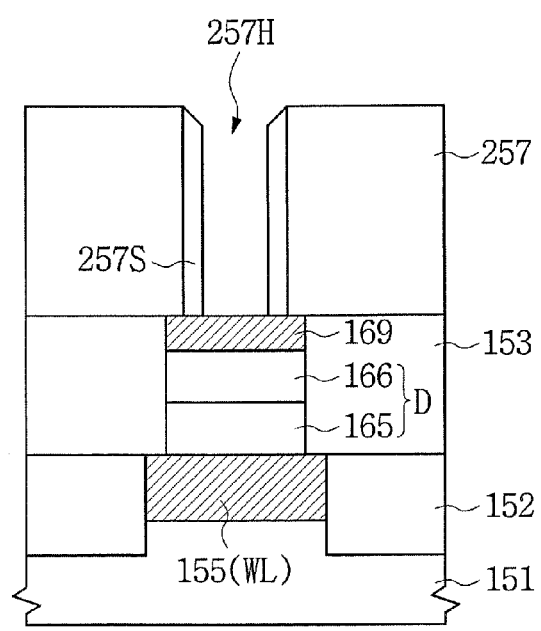
FIGS. 12 through 18 are cross-sectional views taken along line II-II' of FIG. 11, which illustrate a phase-change memory device according to a third exemplary embodiment of the present invention and a fabrication method thereof.

Hereinafter, a method of fabricating the phase-change memory device according to the third exemplary embodiment of the present invention will be described with reference to FIGS. 11 through 18. Referring to FIGS. 11 and 12, an isolation layer 152 may be formed on the semiconductor substrate 151 to define a line-shaped active region. Impurity ions may be implanted in the line-shaped active region to form a word line 155. A lower insulating layer 153 may be formed on the semiconductor substrate 151 having the word line 155. The lower insulating layer 153 may be formed of a silicon oxide layer, a silicon nitride layer, a silicon oxynitride layer, or combinations thereof.

A diode contact hole may be formed through the lower insulating layer 153 to expose the word line 155. A first semiconductor pattern 165, a second semiconductor pattern 166, and a diode electrode 169 may be sequentially stacked in the diode contact hole. The first semiconductor pattern 165 and the second semiconductor pattern 166 may constitute a diode D. The first semiconductor pattern 165 may be formed of an n-type or p-type semiconductor layer. The second semiconductor pattern 166 may be formed of a semiconductor layer having a different conductivity type from the first semiconductor pattern 165. For example, the first semiconductor pattern 165 may be formed of an n-type semiconductor layer, and the second semiconductor pattern 166 may be formed of a p-type semiconductor layer. The first semiconductor pattern 165 may be formed in contact with the word line 155. The diode electrode 169 may be in contact with the second semiconductor pattern 166. The diode electrode 169 may be formed of a conductive layer such as a metal layer or a metal silicide layer. However, the diode electrode 169 may be omitted in alternative embodiments of the invention.

An interlayer insulating layer 257 may be formed on the lower insulating layer 153. The interlayer insulating layer 257 may be formed of a silicon oxide layer, a silicon nitride layer, a silicon oxynitride layer, or combinations thereof. The interlayer insulating layer 257 may be patterned to form a contact hole 257H in order to expose the diode electrode 169. A spacer 257S may be formed on a sidewall of the contact hole 257H. The spacer 257S may be formed of a silicon oxide layer, a silicon nitride layer, a silicon oxynitride layer, or combinations thereof.

Figure 13:
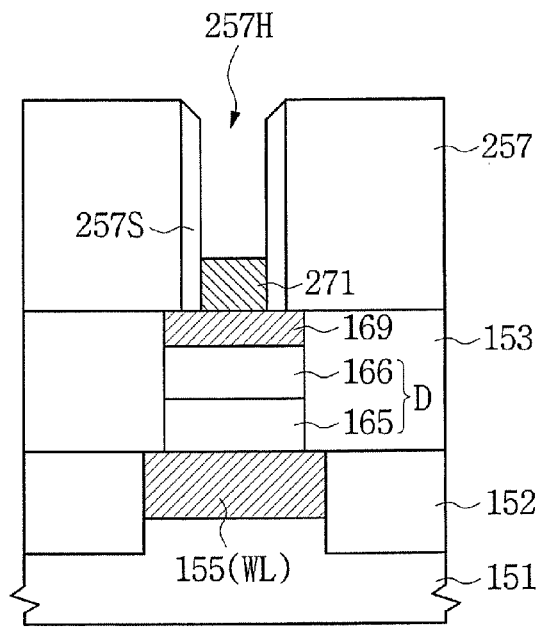

Referring to FIGS. 11 and 13, the contact hole 257H may be partially filled with a lower electrode 271. After the contact hole 257H is filled with a conductive layer, the conductive layer may be etched back to form the lower electrode 271. The lower electrode 271 may be in contact with the diode electrode 169.

The lower electrode 271 may be formed of a material selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a MoTiN layer, a NbN layer, a ZrSiN layer, a ZrAlN layer, a conductive carbon group layer, and a Cu layer, or combinations thereof.

Figure 14:
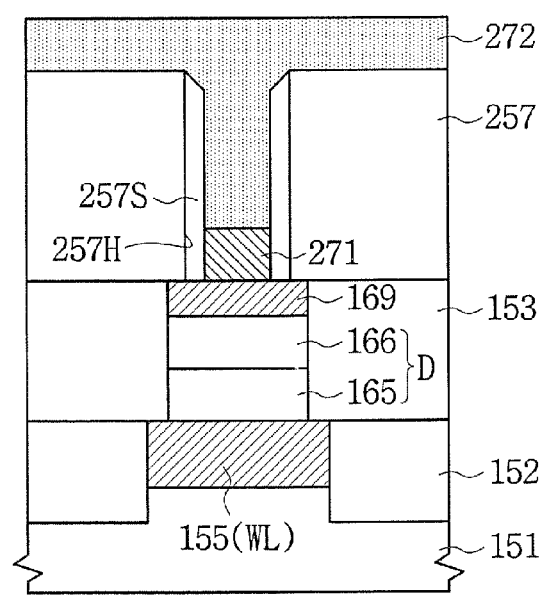

Referring to FIGS. 11 and 14, a first phase-change material layer 272 may be formed to fill the contact hole 257H and to cover the interlayer insulating layer 257. The first phase-change material layer 272 may be formed of a compound of at least two materials selected from the group consisting of Ge, Sb, Te, Se, Bi, Pb, Sn, Ag, Au, As, Pd, In, Ti, S, Si, P, O, and C. For example, the first phase-change material layer 272 may be formed of a phase-changeable material selected from the group consisting of a Ge—Sb—Te layer, a Ge—Bi—Te layer, a Ge—Te—As layer, a Ge—Te—Sn layer, a Ge—Te layer, a Ge—Te—Sn—O layer, a Ge—Te—Sn—Au layer, a Ge—Te—Sn—Pd layer, a Ge—Te—Se layer, a Ge—Te—Ti layer, a Ge—Sb layer, a (Ge, Sn)—Sb—Te layer, a Ge—Sb—(SeTe) layer, a Ge—Sb—In layer, and a Ge—Sb—Te—S layer.

Figure 15:
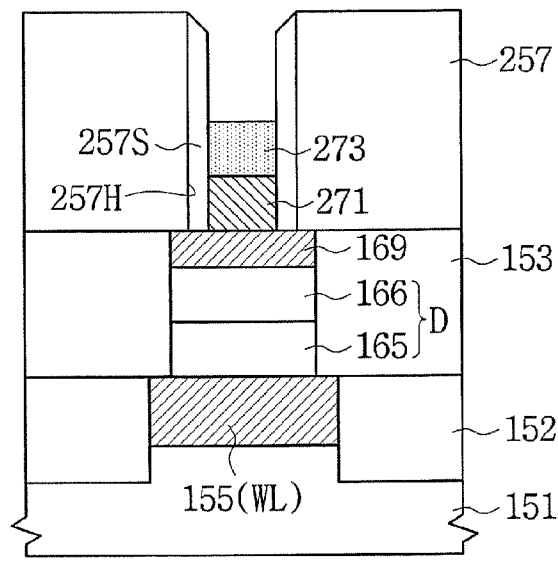

Referring to FIGS. 11 and 15, the first phase-change material layer 272 may be etched back to form a first phase-change pattern 273. The first phase-change pattern 273 may be in contact with the lower electrode 271. The first phase-change pattern 273 may be formed at a lower level than the upper surface of the interlayer insulating layer 257.

Figure 16:
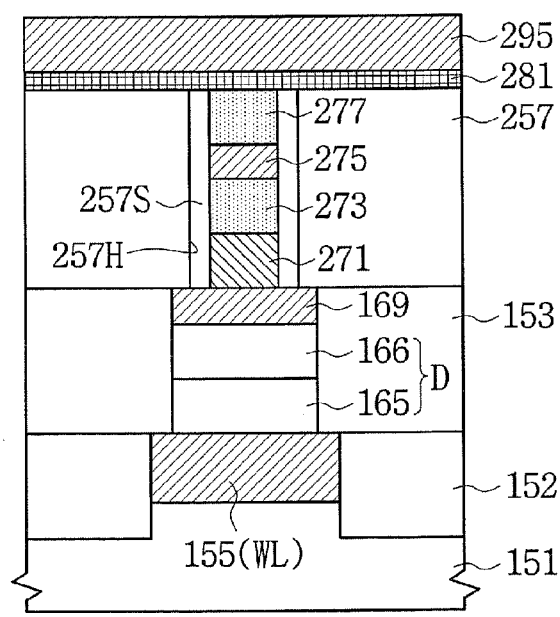

Referring to FIGS. 11 and 16, an intermediate electrode 275 may be formed on the first phase-change pattern 273. A second phase-change pattern 277 may be formed on the intermediate electrode 275. The intermediate electrode 275 and the second phase-change pattern 277 may be formed in the contact hole 257H. An upper surface of the interlayer insulating layer 257 and an upper surface of the second phase-change pattern 277 may be exposed at the same level.

The intermediate electrode 275 may be formed of a material selected from the group consisting of a TiN layer, a TiAlN layer, and a MoTiN layer. The second phase-change pattern 277 may be formed of a compound of at least two materials selected from the group consisting of Ge, Sb, Te, Se, Bi, Pb, Sn, Ag, Au, As, Pd, In, Ti, S, Si, P, O, and C. For example, the second phase-change pattern 277 may be formed of a material selected from the group consisting of a Ge—Sb—Te layer, a Ge—Bi—Te layer, a Ge—Te—As layer, a Ge—Te—Sn layer, a Ge—Te layer, a Ge—Te—Sn—O layer, a Ge—Te—Sn—Au layer, a Ge—Te—Sn—Pd layer, a Ge—Te—Se layer, a Ge—Te—Ti layer, a Ge—Sb layer, a (Ge, Sn)—Sb—Te layer, a Ge—Sb—(SeTe) layer, a Ge—Sb—In layer, and a Ge—Sb—Te—S layer.

A glue layer 281 may be formed on the interlayer insulating layer 257 to cover the second phase-change pattern 277. The glue layer 281 may be formed of a layer having heterogeneity elements. The heterogeneity elements may be at least one selected from the group consisting of Ti, B, In, and Sn. Thus, the glue layer 281 may be formed of a layer having at least one element selected from the group consisting of Ti, B, In, and Sn. For example, the glue layer 281 may be formed of a layer having Ti therein.

An upper conductive layer 295 may be formed on the glue layer 281. The upper conductive layer 295 may be formed of a material selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a MoTiN layer, a NbN layer, a ZrSiN layer, a ZrAlN layer, a conductive carbon group layer, a Cu layer, and combinations thereof.

Figure 17:
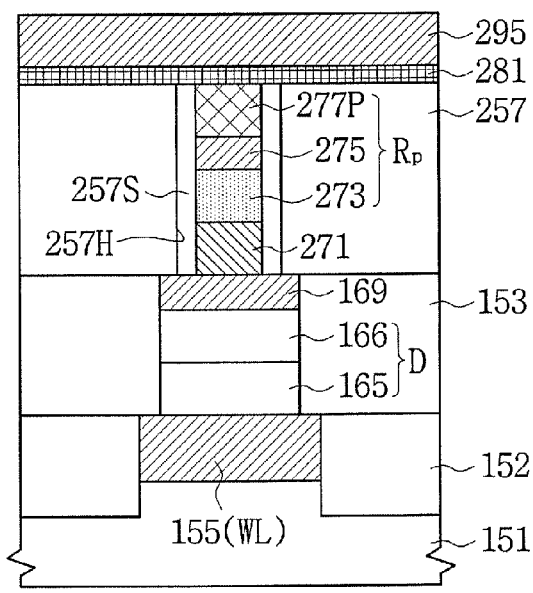

Referring to FIGS. 11 and 17, the heterogeneity elements may be diffused into the second phase-change pattern 277 to form a heterogeneity phase-change pattern 277P. Diffusing the heterogeneity elements into the second phase-change pattern 277 may be performed using a thermal treatment process.

The heterogeneity phase-change pattern 277P may have a different electrical resistance characteristics from the second phase-change pattern 277. For example, when the heterogeneity element is Ti, the heterogeneity phase-change pattern 277P may have a lower electrical resistance than the second phase-change pattern 277. Also, the heterogeneity phase-change pattern 277P may have a different electrical resistance from the first phase-change pattern 273. For example, the heterogeneity phase-change pattern 277P may have a lower electrical resistance than the first phase-change pattern 273. The first phase-change pattern 273, the intermediate electrode 275, and the heterogeneity phase-change pattern 277P may constitute a data storage element $R_P$.

Figure 18:
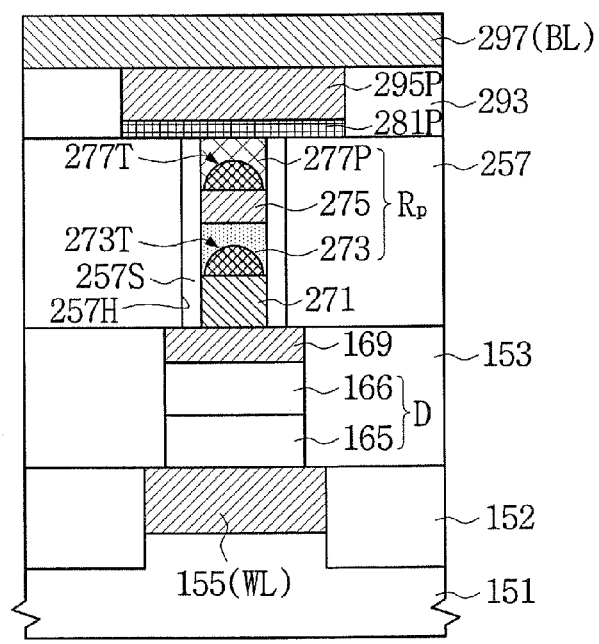

Referring to FIGS. 11 and 18, the upper conductive layer 295 and the glue layer 281 may be patterned to form an upper electrode 295P and a glue pattern 281P, respectively. An upper insulating layer 293 may be formed on the interlayer insulating layer 257. The upper insulating layer 293 may be formed of a silicon oxide layer, a silicon nitride layer, a silicon oxynitride layer, or combinations thereof. The upper insulating layer 293 may be planarized to expose the upper electrode 295P. A bit line 297, which is in contact with the upper electrode 295P, may be formed on the upper insulating layer 293. The bit line 297 may be electrically connected to the word line 155 through the data storage element $R_P$, the lower electrode 271, and the diode D.

Hereinafter, an operation of the phase-change memory device according to the third exemplary embodiment of the present invention will be described with reference again to FIGS. 10, 11, and 18. Referring to FIGS. 10, 11, and 18, the phase-change memory device according to the third exemplary embodiment of the present invention may perform a program operation by supplying a program current through the lower and upper electrodes 271 and 295P to the data storage element $R_P$.

When the program current is supplied to the data storage element $R_P$, a first transition region 273T and a second transition region 277T may be generated in the first phase-change pattern 273 and the heterogeneity phase-change pattern 277P, respectively. The data storage element $R_P$ may have first through fourth composite resistances in response to first through fourth program currents. Thus, the data storage element $R_P$ can be programmed into four distinct states. In this case, the data storage element $R_P$ can store 2-bit data.

Figure 19:
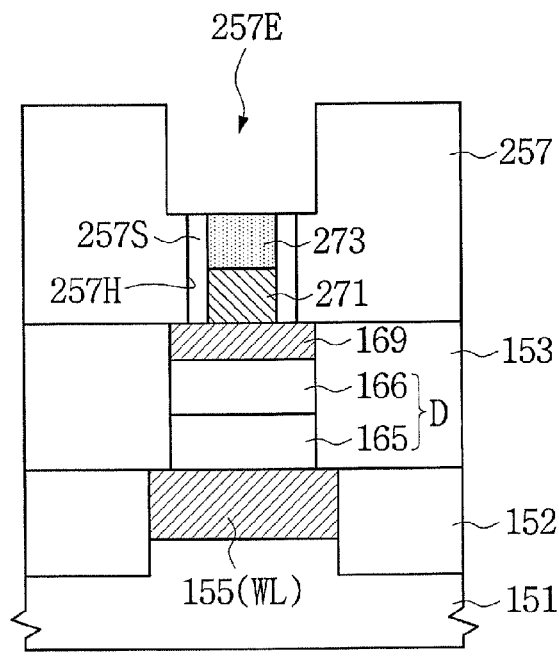
FIGS. 19 through 23 are cross-sectional views taken along line II-II' of FIG. 11, which illustrate a phase-change memory device according to a fourth exemplary embodiment of the present invention and a fabrication method thereof.

Hereinafter, a phase-change memory device according to the fourth exemplary embodiment of the present invention and a fabrication method thereof will be described with reference to FIGS. 11, and 19 through 23. Referring to FIGS. 11 and 19, an isolation layer 152, a word line 155, a lower insulating layer 153, a first semiconductor pattern 165, a second semiconductor pattern 166, a diode electrode 169, an interlayer insulating layer 257, a contact hole 257H, a spacer 257S, a lower electrode 271, and a first phase-change pattern 273 may be formed on a semiconductor substrate 151, as described above with reference to FIGS. 12 through 15.

The interlayer insulating layer 257 may be formed of a silicon oxide layer, a silicon nitride layer, a silicon oxynitride layer, or combinations thereof. The spacer 257S may be formed of a silicon oxide layer, a silicon nitride layer, a silicon oxynitride layer, or combinations thereof. The spacer 257S may be formed of a material having an etch selectivity with respect to the interlayer insulating layer 257. For example, when the interlayer insulating layer 257 is formed a silicon oxide layer, the spacer 257S may be formed of a silicon nitride layer.

The first phase-change pattern 273 may be in contact with the lower electrode 271. The first phase-change pattern 273 may be formed at a lower level than the upper surface of the interlayer insulating layer 257. In this case, the spacer 257S may be exposed on the first phase-change pattern 273 in the contact hole 257H.

Subsequently, the contact hole 257H may be extended to form an extended contact hole 257E on the first phase-change pattern 273. Specifically, extending the contact hole 257H may be performed using an isotropic etching process such as a wet etching process, a dry etching process, or combinations thereof. For example, the spacer 257S exposed on the first phase-change pattern 273 can be removed by the etching process. In this case, the interlayer insulating layer 257 may be exposed on the first phase-change pattern 273. Thus, the extended contact hole 257E may be formed to have a larger diameter than the first phase-change pattern 273. Furthermore, the exposed interlayer insulating layer 257 may be etched to additionally extend the extended contact hole 257E.

Figure 20:
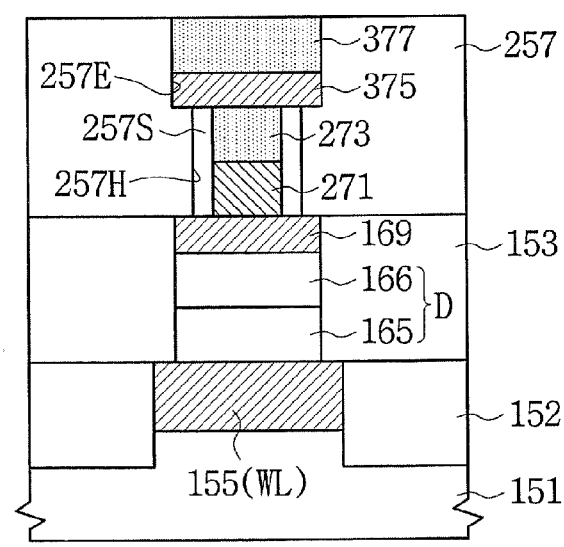

Referring to FIGS. 11 and 20, an intermediate electrode 375 may be formed in the extended contact hole 257E. A second phase-change pattern 377 may be formed on the intermediate electrode 375, which means the intermediate electrode 375 and the second phase-change pattern 377 may be formed in the extended contact hole 257E.

A bottom of the intermediate electrode 375 may be in contact with the first phase-change pattern 273. An upper surface of the intermediate electrode 375 may be in contact with the second phase-change pattern 377. A contact surface of the intermediate electrode 375 and the second phase-change pattern 377 may be wider than that of the intermediate electrode 375 and the first phase-change pattern 273. Also, an upper surface of the interlayer insulating layer 257 and an upper surface of the second phase-change pattern 377 may be exposed at the same level.

The intermediate electrode 375 may be formed of a material selected from the group consisting of a TiN layer, a TiAlN layer, and a MoTiN layer. The second phase-change pattern 377 may be formed of a compound of at least two elements selected from the group consisting of Ge, Sb, Te, Se, Bi, Pb, Sn, Ag, Au, As, Pd, In, Ti, S, Si, P, O, and C. For example, the second phase-change pattern 377 may be a compound selected from the group consisting of a Ge—Sb—Te layer, a Ge—Bi—Te layer, a Ge—Te—As layer, a Ge—Te—Sn layer, a Ge—Te layer, a Ge—Te—Sn—O layer, a Ge—Te—Sn—Au layer, a Ge—Te—Sn—Pd layer, a Ge—Te—Se layer, a Ge—Te—Ti layer, a Ge—Sb layer, a (Ge, Sn)—Sb—Te layer, a Ge—Sb—(SeTe) layer, a Ge—Sb—In layer, and a Ge—Sb—Te—S layer.

Figure 21:
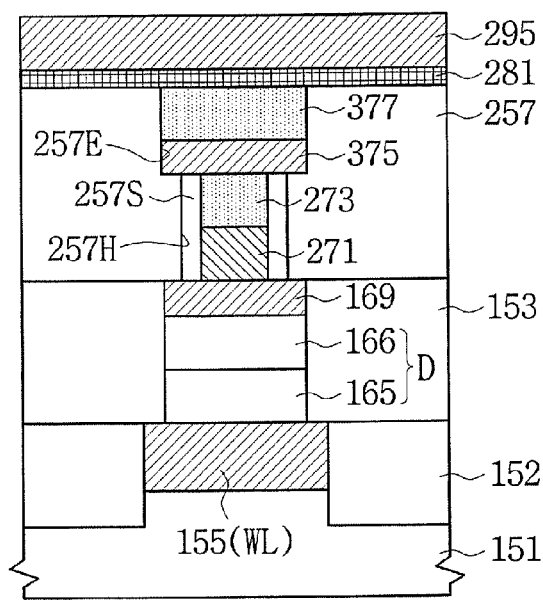

Referring to FIGS. 11 and 21, a glue layer 281 may be formed on the interlayer insulating layer 257 to cover the second phase-change pattern 377. The glue layer 281 may be formed of a layer having heterogeneity elements therein. The heterogeneity elements may be selected from the group consisting of Ti, B, In, and Sn. That is, the glue layer 281 may be formed of a layer having at least one of Ti, B, In, and Sn therein. For example, the glue layer 281 may be formed of a layer having Ti therein. The glue layer 281 may also be omitted in alternative embodiments.

An upper conductive layer 295 may be formed on the glue layer 281. The upper conductive layer 295 may be formed of a material selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a MoTiN layer, a NbN layer, a ZrSiN layer, a ZrAlN layer, a conductive carbon group layer, and a Cu layer, or combinations thereof. However, the upper conductive layer 295 may be omitted in some embodiments of the invention.

Figure 22:
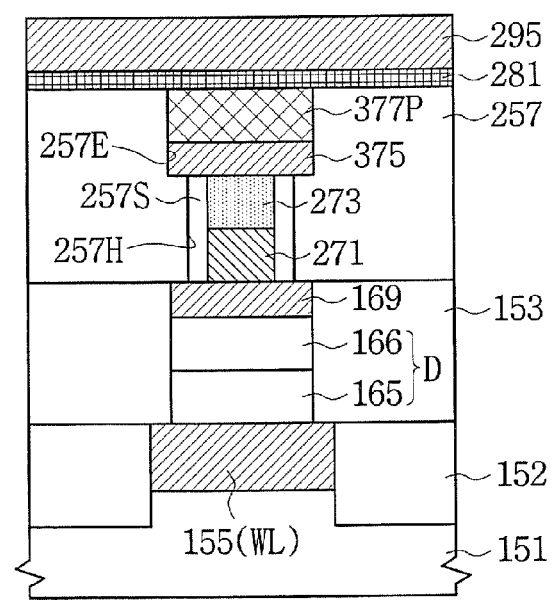

Referring to FIGS. 11 and 22, the heterogeneity elements may be diffused into the second phase-change pattern 377 to form a heterogeneity phase-change pattern 377P. Diffusing the heterogeneity elements into the second phase-change pattern 377 may be performed using a thermal treatment process. The heterogeneity phase-change pattern 377P may have a different electrical resistance from the second phase-change pattern 377. For example, when the heterogeneity element is Ti, the heterogeneity phase-change pattern 377P may have a lower electrical resistance than the second phase-change pattern 377. Also, the heterogeneity phase-change pattern 377P may have a different electrical resistance from the first phase-change pattern 273. For example, the heterogeneity phase-change pattern 377P may have a lower electrical resistance than the first phase-change pattern 273. Alternatively, when the glue layer 281 is omitted, the process of forming the heterogeneity phase-change pattern 377P may be omitted. In this case, the second phase-change pattern 377 may remain on the intermediate electrode 375.

Figure 23:
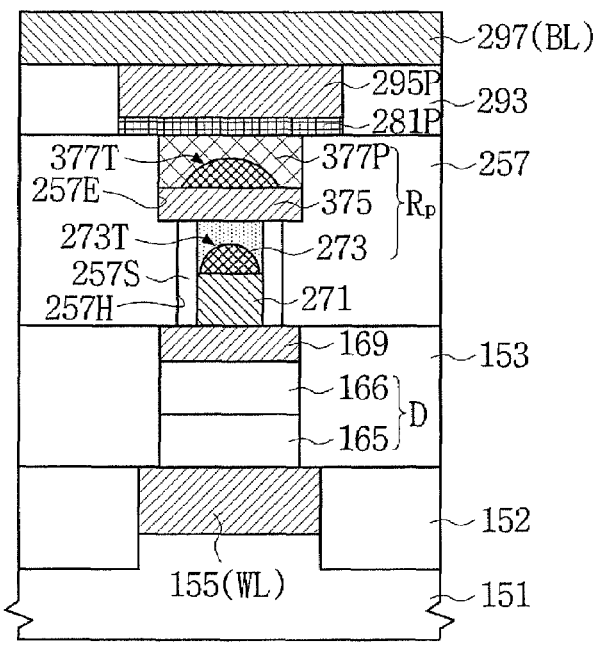
Figure 24:
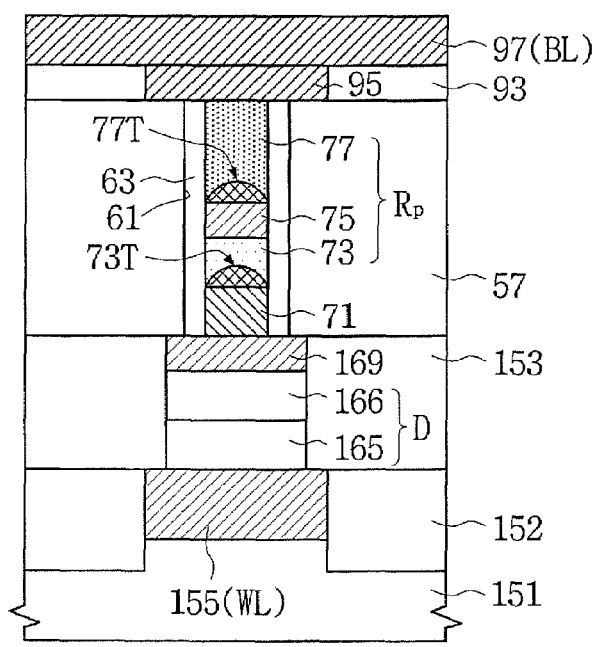
FIG. 24 is a cross-sectional view taken along line II-II' of FIG. 11, which illustrates a phase-change memory device according to a fifth exemplary embodiment of the present invention and a fabrication method thereof.

Referring to FIGS. 11 and 23, the upper conductive layer 295 and the glue layer 281 may be patterned to form an upper electrode 295P and a glue pattern 281P, respectively. An upper insulating layer 293 may be formed on the interlayer insulating layer 257. The upper insulating layer 293 may be formed of a silicon oxide layer, a silicon nitride layer, a silicon oxynitride layer, or combinations thereof. The upper insulating layer 293 may be planarized to expose the upper electrode 295P. However, the upper insulating layer 293, the upper electrode 295P, and the glue pattern 281P may be omitted.

A bit line 297, which is in contact with the upper electrode 295P, may be formed on the upper insulating layer 293. When the upper electrode 295P and the glue pattern 281P are omitted, the bit line 297 may be in contact with the second phase-change pattern 377. The first phase-change pattern 273, the intermediate electrode 375, and the heterogeneity phase-change pattern 377P may constitute a data storage element $R_P$. The bit line 297 may be connected to the word line 155 through the data storage element $R_P$, the lower electrode 271, and the diode D.

Hereinafter, an operation of the phase-change memory device according to the fourth exemplary embodiment of the present invention will be described with reference again to FIGS. 10, 11, and 23. Referring to FIGS. 10, 11, and 23, the phase-change memory device according to the fourth exemplary embodiment of the present invention may perform a program operation by supplying a program current through the lower and upper electrodes 271 and 295P to the data storage element $R_P$. When the program current is supplied to the data storage element $R_P$, a first transition region 273T and a second transition region 377T may be generated in the first phase-change pattern 273 and the heterogeneity phase-change pattern 377P, respectively. That is, the data storage element $R_P$ may have first through fourth composite resistances in response to first through fourth program currents. Thus, the data storage element $R_P$ can be programmed in four states. In this case, the data storage element $R_P$ can store 2-bit data.

Alternatively, when the glue pattern 281P is omitted and the second phase-change pattern 377 remains on the intermediate electrode 375, an electrical resistance between the intermediate electrode 375 and the bit line 297 may be lower than that between the intermediate electrode 375 and the lower electrode 271. In this case, a first transition region 273T and a second transition region 377T may be also generated in the first phase-change pattern 273 and the second phase-change pattern 377, respectively.

Hereinafter, a method of fabricating a phase-change memory device according to the fifth exemplary embodiment of the present invention will be described with reference to FIGS. 11 and 24. Referring to FIGS. 11 and 24, an isolation layer 152, a word line 155, a lower insulating layer 153, a first semiconductor pattern 165, a second semiconductor pattern 166, and a diode electrode 169 are formed on a semiconductor substrate 151, as described above with reference to FIG. 12. An interlayer insulating layer 57 may be formed on the lower insulating layer 153. The interlayer insulating layer 57 may be formed of a silicon oxide layer, a silicon nitride layer, a silicon oxynitride layer, or combinations thereof. The interlayer insulating layer 57 may be patterned to form a contact hole 61 in order to expose the diode electrode 169. A spacer 63 may be formed on a sidewall of the contact hole 61. The spacer 63 may be formed of a silicon oxide layer, a silicon nitride layer, a silicon oxynitride layer, or combinations thereof. Subsequently, a first electrode 71, a first phase-change pattern 73, an intermediate electrode 75, a second phase-change pattern 77, a second electrode 95, an upper insulating layer 93, and a bit line 97 may be formed in the same manner as described above with reference to FIGS. 5 through 8. The bit line 97 may be in contact with the second electrode 95.

Figure 25:
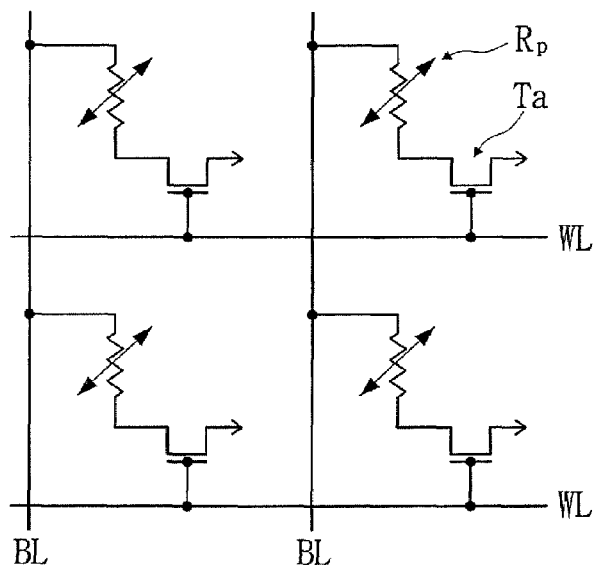
FIG. 25 is an equivalent circuit diagram of a portion of a cell array region of a phase-change memory device according to sixth to eighth exemplary embodiments of the present invention.
Figure 26:
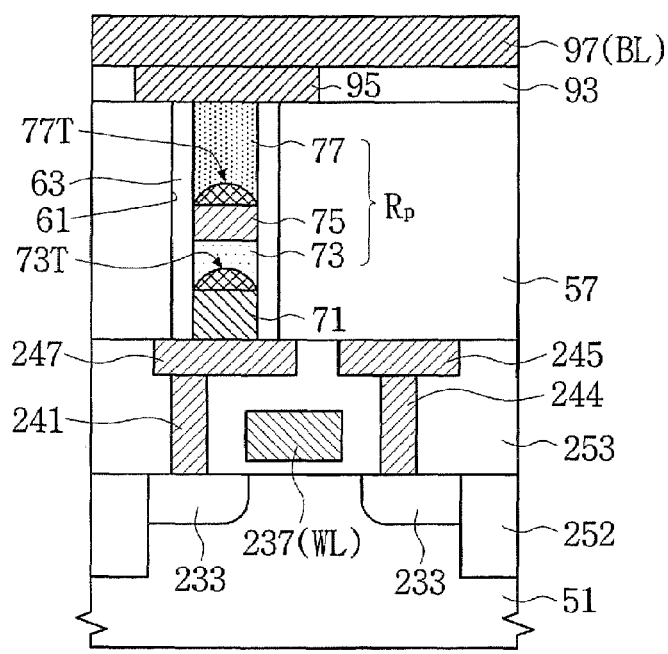
FIG. 26 is a cross-sectional view, which illustrates a phase-change memory device according to a sixth exemplary embodiment of the present invention and a fabrication method thereof.
Figure 27:
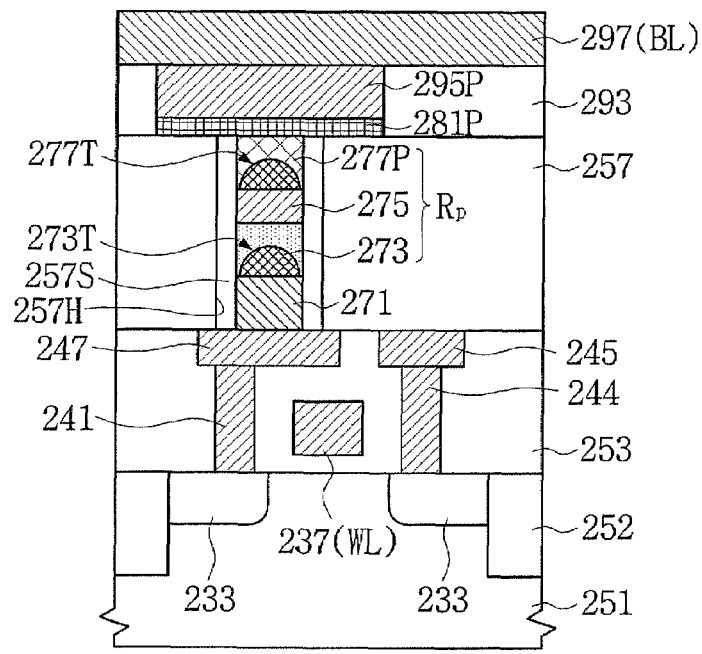
FIG. 27 is a cross-sectional view, which illustrates a phase-change memory device according to a seventh exemplary embodiment of the present invention and a fabrication method thereof.
Figure 28:
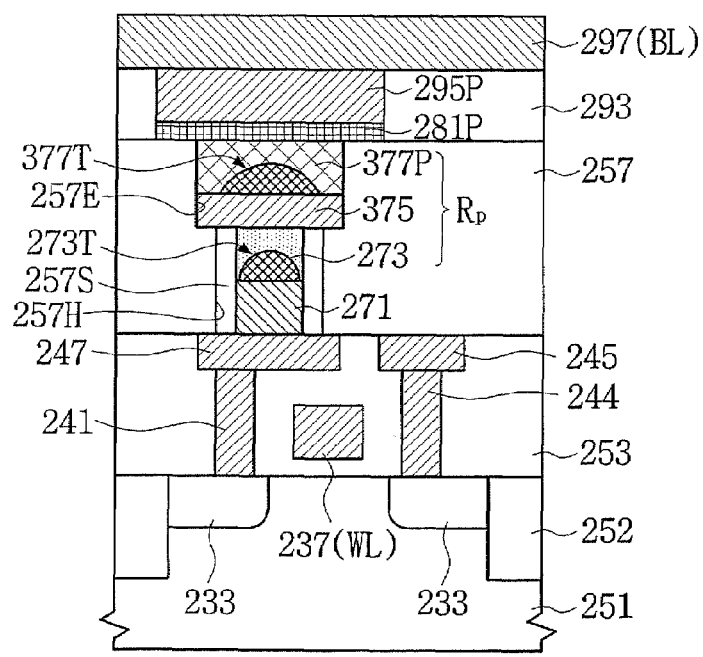
FIG. 28 is a cross-sectional view, which illustrates a phase-change memory device according to an eighth exemplary embodiment of the present invention and a fabrication method thereof.

FIG. 25 is an equivalent circuit diagram of a portion of a cell array region of a phase-change memory device according to sixth to eighth exemplary embodiments of the present invention, FIG. 26 is a cross-sectional view, which illustrates a phase-change memory device according to a sixth exemplary embodiment of the present invention and a fabrication method thereof, FIG. 27 is a cross-sectional view, which illustrates a phase-change memory device according to a seventh exemplary embodiment of the present invention and a fabrication method thereof, and FIG. 28 is a cross-sectional view, which illustrates a phase-change memory device according to an eighth exemplary embodiment of the present invention and a fabrication method thereof.

Referring to FIG. 25, the phase-change memory device according to the sixth to eighth exemplary embodiments of the present invention may include bit lines BL, which are disposed parallel to one another in a column direction, word lines WL, which are disposed parallel to one another in a row direction, a plurality of data storage elements $R_P$, and a plurality of MOS transistors Ta.

The bit lines BL may cross-over the word lines WL. The data storage elements $R_P$ may be disposed at intersections of the bit lines BL and the word lines WL, respectively. Each of the MOS transistors Ta may be serially connected to the corresponding one of the data storage elements $R_P$. One end of each of the data storage elements $R_P$ may be connected to the corresponding one of the bit lines BL, respectively. Each of the MOS transistors Ta may be connected to the corresponding one of the word lines WL. The MOS transistors Ta may function as switching devices. However, the MOS transistors Ta may be omitted. Alternatively, diodes may be employed as the switching devices instead of the MOS transistors Ta.

In another exemplary embodiment, a bit line (not shown) may be connected to one of source and drain regions of the MOS transistor Ta. One end of the data storage element $R_P$ may be connected to the other one of the source and drain regions. In this case, the other end of the data storage element $R_P$ may be connected to a plate electrode (not shown).

Hereinafter, a method of fabricating the phase-change memory device according to the sixth exemplary embodiment of the present invention will be described with reference to FIG. 26. Referring to FIG. 26, an isolation layer 252 may be formed in a substrate 51 to define an active region. The isolation layer 252 may be formed of an insulating layer such as a silicon oxide layer, a silicon nitride layer, a silicon oxynitride layer, or combinations thereof. A gate electrode 237 may be formed on the active region. The gate electrode 237 may function as a word line WL. The gate electrode 237 may be formed of a conductive layer such as a poly-Si layer, a metal layer, a metal silicide layer, or combinations thereof. Source and drain regions 233 may be formed in the active region on both sides of the gate electrode 237. The gate electrode 237, the substrate 51, and the source and drain regions 233 may constitute a MOS transistor (refer to Ta of FIG. 25).

A lower insulating layer 253 may be formed on the MOS transistor Ta and the isolation layer 252. The lower insulating layer 253 may be formed of a silicon oxide layer, a silicon nitride layer, a silicon oxynitride layer, or combinations thereof.

A source plug 244, a drain plug 241, a source line 245, and a drain pad 247 may be formed in the lower insulating layer 253. The source line 245 may be electrically connected to one of the source and drain regions 233 through the source plug 244 that penetrates the lower insulating layer 253. The drain pad 247 may be electrically connected to the other one of the source and drain regions 233 through the drain plug 241 that penetrates the lower insulating layer 253. The source line 245, the drain pad 247, the source plug 244, and the drain plug 241 may be formed of a conductive layer.

An interlayer insulating layer 57 may be formed on the lower insulating layer 253. The interlayer insulating layer 57 may be a silicon oxide layer, a silicon nitride layer, a silicon oxynitride layer, or combinations thereof. The interlayer insulating layer 57 may be patterned to form a contact hole 61 in order to expose the drain pad 247. A spacer 63 may be formed on a sidewall of the contact hole 61. The spacer 63 may be formed of a silicon oxide layer, a silicon nitride layer, a silicon oxynitride layer, or combinations thereof.

Thereafter, a first electrode 71, a first phase-change pattern 73, an intermediate electrode 75, a second phase-change pattern 77, a second electrode 95, an upper insulating layer 93, and a bit line 97 may be formed in the same manner as described above with reference to FIGS. 5 through 8. The first electrode 71 may be formed in contact with the drain pad 247. The bit line 97 may be formed in contact with the second electrode 95.

Hereinafter, an operation of the phase-change memory device according to the sixth exemplary embodiment of the present invention will be described with reference to FIGS. 25 and 26. Referring to FIGS. 25 and 26, the phase-change memory device according to the sixth exemplary embodiment of the present invention may perform a program operation by supplying a program current to the data storage element $R_P$. When the program current is supplied to the data storage $R_P$, a first transition region 73T and a second transition region 77T may be generated in the first phase-change pattern 73 and the second phase-change pattern 77, respectively. That is, the data storage element $R_P$ may have first through fourth composite resistances in response to first through fourth program currents. Thus, the data storage element $R_P$ can be programmed in four states. In this case, the data storage element $R_P$ can store 2-bit data.

Hereinafter, a method of fabricating the phase-change memory device according to the seventh exemplary embodiment of the present invention will be described with reference to FIG. 27. Referring to FIG. 27, an isolation layer 252, a gate electrode 237, source and drain regions 233, a lower insulating layer 253, a source plug 244, a drain plug 241, a source line 245, and a drain pad 247 may be formed on a substrate 251, as described above with reference to FIG. 26.

An interlayer insulating layer 257 may be formed on the lower insulating layer 253. The interlayer insulating layer 257 may be formed of a silicon oxide layer, a silicon nitride layer, a silicon oxynitride layer, or combinations thereof. The interlayer insulating layer 257 may be patterned to form a contact hole 257H in order to expose the drain pad 247. A spacer 257S may be formed on a sidewall of the contact hole 257H. The spacer 257S may be formed of a silicon oxide layer, a silicon nitride layer, a silicon oxynitride layer, or combinations thereof.

Thereafter, a lower electrode 271, a first phase-change pattern 273, an intermediate electrode 275, a heterogeneity phase-change pattern 277P, a glue pattern 281P, an upper electrode 295P, an upper insulating layer 293, and a bit line 297 may be formed in the same manner as described above with reference to FIGS. 13 through 18. The lower electrode 271 may be in contact with the drain pad 247.

Hereinafter, an operation of the phase-change memory device according to the seventh exemplary embodiment of the present invention will be described with reference to FIGS. 25 and 27. Referring to FIGS. 25 and 27, the phase-change memory device according to the seventh exemplary embodiment of the present invention may perform a program operation by supplying a program current to the data storage element $R_P$. When the program current is supplied to the data storage element $R_P$, a first transition region 273T and a second transition region 277T may be generated in the first phase-change pattern 273 and the heterogeneity phase-change pattern 277P, respectively. That is, the data storage element $R_P$ may have first through fourth composite resistances in response to first through fourth program currents. Thus, the data storage element $R_P$ can be programmed in four states. In this case, the data storage element $R_P$ can store 2-bit data.

Hereinafter, a method of fabricating a phase-change memory device according to the eighth exemplary embodiment of the present invention will be described with reference to FIG. 28. Referring to FIG. 28, an isolation layer 252, a gate electrode 237, source and drain regions 233, a lower insulating layer 253, a source plug 244, a drain plug 241, a source line 245, a drain pad 247, an interlayer insulating layer 257, a contact hole 257H, and a spacer 257S may be formed on a substrate 251, as described above with reference to FIG. 26.

Thereafter, a lower electrode 271, a first phase-change pattern 273, an extended contact hole 257E, an intermediate electrode 375, a heterogeneity phase-change pattern 377P, a glue pattern 281P, an upper electrode 295P, an upper insulating layer 293, and a bit line 297 may be formed in the same manner as described above with reference to FIGS. 19 through 23. The lower electrode 271 may be in contact with the drain pad 247.

Hereinafter, an operation of the phase-change memory device according to the eighth exemplary embodiment of the present invention will be described with reference to FIGS. 25 and 28. Referring to FIGS. 25 and 28, the phase-change memory device according to the eighth exemplary embodiment of the present invention may perform a program operation by supplying a program current to the data storage element $R_P$.

When the program current is supplied to the data storage element $R_P$, a first transition region 273T and a second transition region 377T may be generated in the first phase-change pattern 273 and the heterogeneity phase-change pattern 377P, respectively. That is, the data storage element $R_P$ may have first through fourth composite resistances in response to first through fourth program currents. Thus, the data storage element $R_P$ can be programmed in four states. In this case, the data storage element $R_P$ can store 2-bit data.

According to the exemplary embodiments of the present invention as described above, first and second electrodes are provided opposite to each other on a substrate. A data storage element is disposed between the first and second electrodes. The data storage element includes at least one intermediate electrode and a plurality of phase-change patterns. The first electrode and the data storage element are disposed in a contact hole that penetrates an interlayer insulating layer. The data storage element can store multi-bit data corresponding to the number of the phase-change patterns. As a consequence, a multi-bit phase-change memory device having small transition regions can be embodied.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming an integrated circuit device, comprising:
   forming at least one non-volatile memory cell on a substrate, said at least one non-volatile memory cell comprising a plurality of phase-changeable material regions therein that are electrically coupled in series and collectively configured to support at least 2-bits of data when serially programmed using at least four serial program currents, said forming comprising;
   forming at least one interlayer insulating layer on the substrate;
   forming at least one contact hole extending through the at least one interlayer insulating layer; and
   forming at least two serially coupled phase-changeable material regions in the at least one contact hole.

2. The method of claim 1, wherein each of the at least two serially-coupled phase-changeable material regions comprises a different phase-changeable material.

3. The method of claim 2, wherein the at least two serially coupled phase-changeable material regions comprise equivalent phase-changeable materials having different electrical resistance characteristics.

4. The method of claim 2, wherein the at least two serially coupled phase-changeable material regions comprise equivalent phase-changeable materials having different cross-sectional areas relative to a direction of the at least four serial program currents.

5. The method of claim 1, further comprising:
forming a glue layer having a concentration of at least one heterogeneity element therein, in contact with at least one of the plurality of phase-changeable material regions; and
thermally treating the glue layer at a sufficient temperature and for a sufficient duration to diffuse the at least one heterogeneity element into at least one of the plurality of phase-changeable material regions in contact with the glue layer.

6. The method of claim 5, wherein each of the at least one heterogeneity element is selected from a group consisting of Ti, B, In and Sn.

7. The method of claim 1, wherein said forming further comprises:
forming an intermediate electrode comprising a material selected from a group consisting of TiN, TiAlN and MoTiN, in contact with at least one of the plurality of phase-changeable material regions.

8. The method of claim 1, wherein forming at least two serially coupled phase-changeable material regions is preceded by forming an electrically insulating spacer along at least a portion of a sidewall of the at least one contact hole.

9. A method of fabricating a phase-change memory device, comprising:
forming an interlayer insulating layer having a contact hole on a substrate,
forming a first electrode to partially fill the contact hole,
forming a first phase-change pattern on the first electrode in the contact hole,
forming an intermediate electrode on the first phase-change pattern,
forming a second phase-change pattern on the intermediate electrode, and
forming a second electrode electrically connected to the second phase-change pattern on the interlayer insulating layer.

10. The method according to claim 9, further comprising:
after forming the second phase-change pattern,
forming a glue layer having a heterogeneity element and in contact with the second phase-change pattern; and
diffusing the heterogeneity element into the second phase-change pattern.

11. The method according to claim 10, wherein the heterogeneity element is at least one selected from the group consisting of Ti, B, In, and Sn.

12. The method according to claim 10, wherein diffusing the heterogeneity element into the second phase-change pattern is performed using a thermal treatment process.

13. The method according to claim 9, wherein the intermediate electrode is formed of one selected from the group consisting of a TiN layer, a TiAlN layer, and a MoTiN layer.

14. The method according to claim 9, further comprising:
extending the contact hole formed on the first phase-change pattern after forming the first phase-change pattern.

15. The method according to claim 14, further comprising:
forming a spacer on a sidewall of the contact hole before forming the first electrode.

16. The method according to claim 15, wherein extending the contact hole comprises exposing the spacer on the first phase-change pattern and isotropically etching the exposed spacer.

17. The method according to claim 14, wherein a contact surface of the intermediate electrode and the second phase-change pattern is formed wider than that of the intermediate electrode and the first phase-change pattern.

18. The method according to claim 9, wherein the first phase-change pattern is formed of a compound of at least two selected from the group consisting of Ge, Sb, Te, Se, Bi, Pb, Sn, Ag, Au, As, Pd, In, Ti, S, Si, P, 0, and C.

19. The method according to claim 9, wherein the second phase-change pattern is formed of a compound of at least two selected from the group consisting of Ge, Sb, Te, Sc, Bi, Pb, Sn, Ag, Au, As, Pd, In, Ti, S, Si, P, O, and C.

20. The method according to claim 19, wherein the second phase-change pattern is formed to have a different electrical resistance from the first phase-change pattern.

21. The method according to claim 19, wherein the second phase-change pattern is formed of a different material from the first phase-change pattern.

* * * * *